United States Patent [19]

Ueno

[11] Patent Number: 4,851,888
[45] Date of Patent: Jul. 25, 1989

[54] CONDUCTIVITY MODULATION TYPE VERTICAL MOS-FET

[75] Inventor: Katsunori Ueno, Kanagawa, Japan

[73] Assignee: Fuji Electric Co., Ltd., Japan

[21] Appl. No.: 77,852

[22] Filed: Jul. 27, 1987

[30] Foreign Application Priority Data

Sep. 24, 1986 [JP] Japan .............................. 61-225604

[51] Int. Cl.$^4$ ...................... H01L 29/78; H01L 29/74
[52] U.S. Cl. .................................. 357/23.4; 357/23.8; 357/38
[58] Field of Search ..................... 357/23.4, 38, 23.8

[56] References Cited

U.S. PATENT DOCUMENTS 4,631,564 12/1986 Neilson et al. ..................... 357/23.4
4,682,195  7/1987 Yilmaz ............................... 357/23.4

OTHER PUBLICATIONS

Nakagawa et al., "Non-Latch-Up 1200V 75A Bipolar-Mode MOSFET with Large ASO", IEDM 1984, pp. 860–861.

Primary Examiner—Eugene R. LaRoche
Assistant Examiner—Michael B. Shingleton
Attorney, Agent, or Firm—Stevens, Davis, Miller & Mosher

[57] ABSTRACT

The MOS-FET includes a semiconductor substrate of a first conductivity type functioning as a drain layer; first base layer of a second conductivity type formed on the substrate; second base layer of the first conductivity type which is formed on a surface of the first base layer and which has a portion which forms a channel region surface where an inversion layer is formed between the source layer and the first base layer; a source layer of the second conductivity type formed on the second base layer; a gate oxidation film which is formed on the source layer, the second base layer and the first base layer and which has a thick oxidation film portion covering a portion of the channel region surface and a thin oxidation film portion covering an active portion of the MOS-FET; and a gate polysilicon layer formed on a surface of one of (i) the thin oxidation film portion and (ii) the thin oxidation film portion and the thick oxidation film portion, such that the thick oxidation film portion is disposed between the channel region portion where the inversion layer is formed and the gate polysilicon layer, so as to prevent the inversion layer from being produced in the portion of the channel region surface which is covered by the thick oxidation film portion.

2 Claims, 4 Drawing Sheets

CONDUCTIVITY MODULATION TYPE VERTICAL MOS-FET

BACKGROUND OF THE INVENTION

1. Field of the Invention

The present invention generally relates to a conductivity modulation type MOS-FET and particularly relates to a conductivity modulation type vertical MOS-FET.

2. Description of the Prior Art

FIG. 4 shows a cross-section of a main portion of, for example, a general vertical MOS-FET. The main portion is provided with a gate electrode 1, a source electrode 2, a drain electrode 3, and N− base layer 4, a P+ layer 5, a P base layer 6, and N+ drain layer 7, an N+ source layer 8, a gate polysilicon layer 9, a gate oxidation film 10, and an insulation oxidation film 11. Symbols S, G, and D represent the terminals of the source, the gate, and the drain respectively.

In FIG. 4, if a positive voltage is applied to the gate electrode 1, an inversion layer is formed as a channel for electrons in the surface of the P base layer 6 under the gate polysilicon layer 9, i.e., in the area A shown encircled by a dotted line in the drawing. Therefore, a conductive state is caused between the source electrode 2 and the drain electrode 3. In this case, current components are carried by electrons, and a flow of majority carries of the source electrode 2 or the drain electrode 3 forms a current which is shown as a flow of electrons by an arrow e in FIG. 4. Thus, a general MOS-FET is a mono-polar device in which current components are carried only be electrons or by holes.

On the other hand, FIG. 5 shows a structure of a bi-polar device which is almost the same in structure as the vertical MOS-FET shown in FIG. 4 but in which a larger current can be utilized. In FIG. 5, elements similar to those in FIG. 4 are correspondingly referenced. In FIG. 5, the N+ drain layer 7 of FIG. 4 is replaced by a P+ anode layer 12. In this structure, the area A of a P base layer 6 is inverted, and if electrons flow into an N− base layer 4, holes are injected from the P+ anode layer 12 into the N− base layer 4 so that the carrier density in the N− base layer 4 increases by a large amount. That is, the N− base layer 4 is subject to conductivity modulation to thereby decrease in resistance so as to have a large current density. In FIG. 5, an arrow h indicates the direction of the hole current.

FIG. 6 illustrates the manufacturing steps for a conductivity modulation type MOS-FET. In the drawings, the P+ anode layer are not illustrated, and the steps after formation of the anode layer are not illustrated. The steps after formation of the N− base layer 4 on the P+ anode layer are shown in order. First, the P+ layer 5 is formed on the N− base layer 4, and at the same time the SiO2 film 13 is partly removed (FIG. 6(b)). Then the SiO2 gate oxidation film 10 is formed (FIG. 6(c)). Thereafter, the gate polysilicon layer 9 is formed (FIG. 6(d)). Further, a diffusion process is performed to form the P base layer 6 and the N+ source layer 8 (FIG. 6(e)). The oxidation film 11 is formed (FIG. 6(f)). Finally, the gate electrode 1 and the source electrode 2 of metal such as aluminum are formed (FIG. 6(g)).

The above is a brief description of the structure, operation, and manufacturing steps of a conductivity modulation type MOS-FET as shown in FIG. 5. This device, however, has a defect in that if a very large current is caused to flow through the device, a main current begins to flow through a part of the device other than the area A in the surface of the P base layer 6 so that the gate G cannot control the current any longer. This phenomenon is called "latch-up" and is caused by the structure of the device which forms a PNPN thyristor as shown in FIG. 5.

Referring to the model diagram of FIG. 7, the following is a description of the latch-up phenomenom. In the drawing, the symbol $R_N$ represents a resistance of the N+ source layer 8, $R_p$ represents a series resistance of the P base layer 6 and the P+ layer 5, and $I_e$ and $I_h$ respectively represent an electron current and a hole current which flow through the resistances $R_N$ and $R_P$. Voltage drops across the respective resistance $R_N$ and $R_P$ are expressed as follows on the basis of the source:

Due to the electron current: $I_e R_N$     (1)

Due to the hole current: $I_h R_P$     (2)

The junction between the P base layer 6 and the N+ source layer 8 has a forward bias when the following expression (3) is satisfied:

$$I_e R_N + V_B \leq I_h R_P \quad (3)$$

where $V_B$ represents a potential difference at the junction between the P base layer 6 and the N+ source layer 8. At that time, the NPN transistor constituted by the $N^{30}$ source layer 8, the P base layer 6, the P+ layer 5, and the N− base layer 4 becomes conductive and a number of holes and electrons begin to flow through the junction, so that the device cannot be made non-conductive any longer even if a gate potential is applied which is at an off state because a current is flowing through a part of the device other than the channel. As a result, current continues to flow with ultimate damage to the device. As described above, despite having a capability of making the current density sufficiently large, the conductivity modulation type MOS-FET has a problem in that a large current cannot be utilized in practice due to the latch-up phenomenon. Solution of this problem has been desired.

SUMMARY OF THE INVENTION

An object of the present invention is therefore to solve the above-described problem in the prior art.

Another object of the present invention is to provide a conductivity modulation type vertical MOS-FET which can be produced with little change in manufacturing steps of general vertical MOS-FETs.

A further object of the present invention is to provide a conductivity modulation type vertical MOS-FET in which the latch-up phenomenon can be prevented from occurring.

In order to achieve the above objects, in the conductivity modulation type vertical MOS-FET according to the present invention, a part of a gate oxidation film formed on a channel is covered with a thick oxidation film so as to partly eliminate a transit path of majority carries without making the channel conductive while leaving a transit path of minority carriers, so that as a result a latch-up current will be larger than an operation current.

DETAILED DESCRIPTION OF THE INVENTION

Preferred embodiments according to the present invention will be described hereunder.

Figure 1:
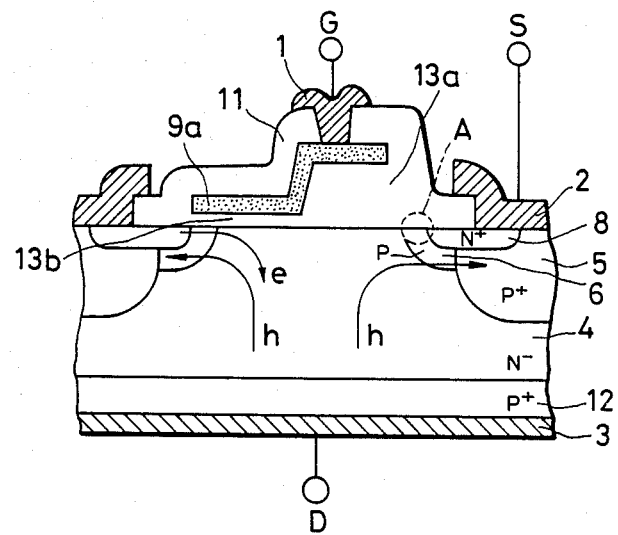
FIG. 1 is a cross-sectional view showing a main portion of the vertical MOS-FET according to the present invention.
Figure 5:
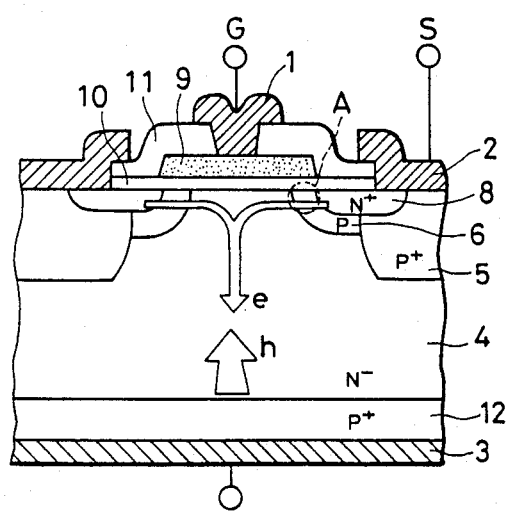
FIG. 5 is a cross-sectional view showing a main portion of a conventional vertical MOS-FET provided with an anode layer.
Figure 6A:
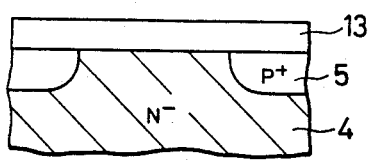
FIG. 6 shows the primary steps in the manufacturing process of the conventional device.
Figure 6B:
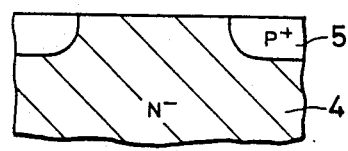
Figure 6C:
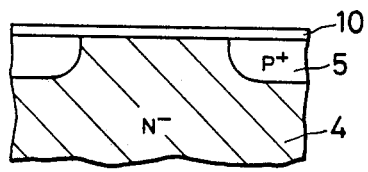
Figure 6D:
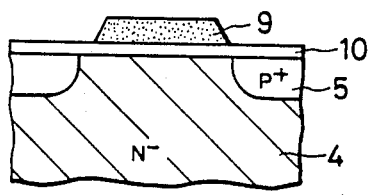
Figure 6E:
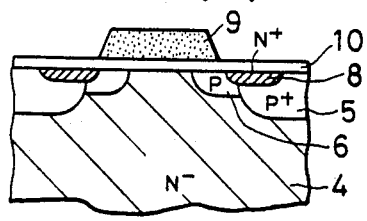
Figure 6F:
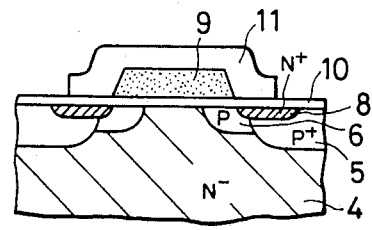
Figure 6G:
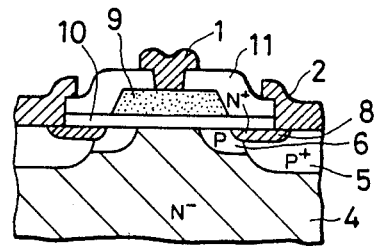
Figure 7:
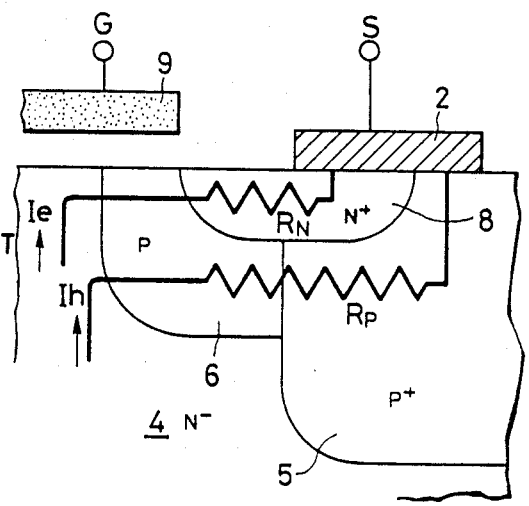
FIG. 7 is a model diagram for explaining the latch-up operation.

FIG. 1 shows a cross-section of a main portion of a vertical MOS-FET having an N-channel which is obtained according to the present invention. In the drawing, items equivalent to those in FIG. 5 discussed above are correspondingly referenced. FIG. 1 is different from FIG. 5 in that a part corresponding to the portion A of the P base layer 6 forming the surface channel is covered with a thich oxidation film 13a and the shape of a gate electrod 9a is determined corresponding to the oxidation film 13a. In the thus arranged device shown in FIG. 1, it is necessary to apply a large voltage to the surface of the device through the thick oxidation film 13a so as to invert the surface. Therefore, the P base layer 6 in the surface is never inverted in a general operating range and no electron flow occurs in the P layer covered with the thick oxidation film 13a while the surface of the P layer covered with a thin oxidation film 13b is inverted so as to allow electron flow to occur. Therefore, a part of the hole current flowing under the channel is made to flow into the P layer under the thick oxidation film 13a, so that the hole current under the channel region decreases. That is, in the device of FIG. 1, the number of holes moving from P+ anode layer 12 decreases compared with those in the device shown in FIG. 5. In FIG. 1, the electron and hole currents are designated by arrows e and h respectively.

In the above-mentioned expression (3), if the hole current $I_h$ decreases, the value of $I_h R_P$ also descreases, so that it becomes difficult to satify the expression (3) which is a condition for causing the latch-up phenomenon. Accordingly, in the device of FIG. 1 in which the current $I_h$ decreases, the current necessary to cause the latch-up phenomemon is made large.

Figure 2:
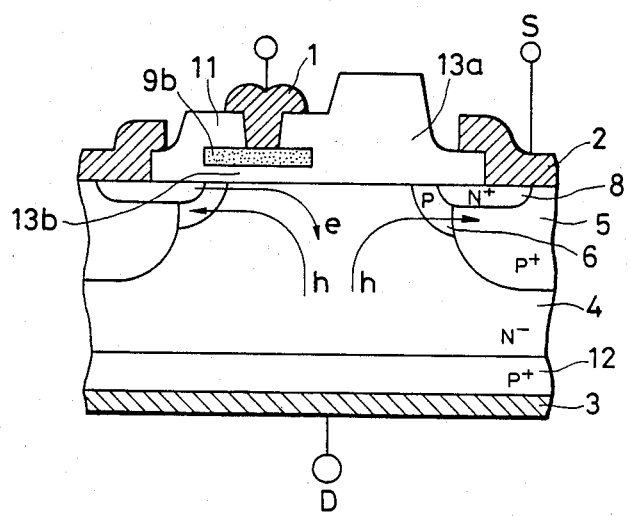
FIG. 2 is a cross-sectional view showing a main portion of the vertical MOS-FET according to the present invention with a modified gate electrode arrangement from that shown in FIG. 1.

It is not always necessary that the gate electrode 9a is disposed on the thick oxidation film 13a. FIG. 2 shows another embodiment of the gate arrangement in which a gate electrode 9b is diposed on a thin oxidation film 13b. In this arrangement, there is an advantage that the area of the gate electrode 9b is narrower than that of the gate electrode 9a in FIG. 1 so that the gate capacity can be decreased.

As described above, in the device according to the present invention the latch-up current is made larger than the operating current by forming a thick oxidation film 13a on a part of the channel region surface, and therefore the device can be produced by employing the conventional manufacturing steps as they are generally performed without requiring any special assembly devices.

FIG. 3 shows the primary steps of a manufacturing process for a device having a structure as shown in FIG. 1 corresponding to those steps shown in FIG. 6. That is, the steps shown in (a) - (g) of FIG. 3 correspond to those shown in (a) - (g) of FIG. 6. The manufacturing step of FIG. 3(a) is quite the same as that of FIG. 6(a), and in this step, the SiO$_2$ field oxidation film 13 if formed to cover layers 4 and 5. The major point of difference of the process shown in FIG. 3 from that shown in FIG. 6 is in the step of FIG. 3(b) in which the field oxidation film 13 is largely removed through an etching process with a part thereof left as it is. In the step of FIG. 3(c), the SiO$_2$ gate oxidation film 10 is formed so as to cover the remaining portion of the oxidation film 13. Then, in the step of FIG. 3(d), the gate polysilicon layer 9a is formed over the portion of films 10 and 13 corresponding to the thick oxidation film 13a in FIG. 1. Thereafter, through the same procedure as that of FIG. 6, a diffusion step is performed to form the P base layer 6 and the N+ source layer 8 in the step of FIG. 3(e), the oxidation layer 11 is formed in the step of FIG. 3 (f), and then the gate electrode 1 and the souce electrode 2 are provided in the step of FIG. 3(g).

Figure 3A:
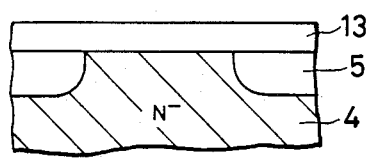
FIG. 3 shows the primary steps in the manufacturing process of the vertical MOS-FET according to the present invention.
Figure 3B:
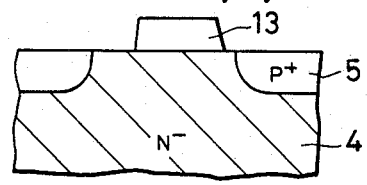
Figure 3C:
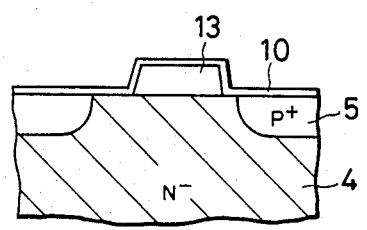
Figure 3D:
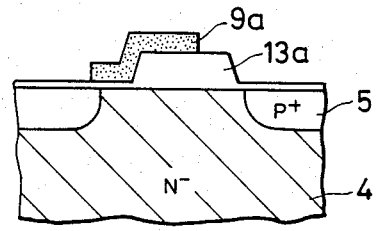
Figure 3E:
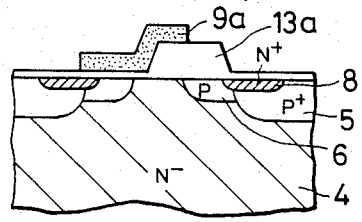
Figure 3F:
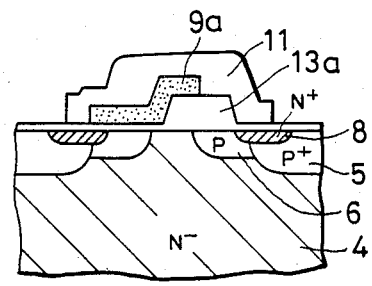
Figure 3G:
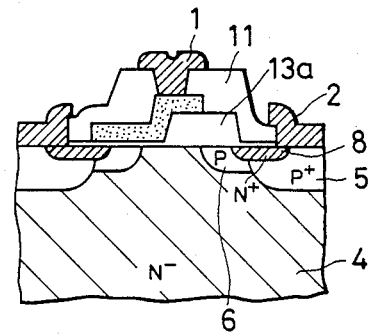
Figure 4:
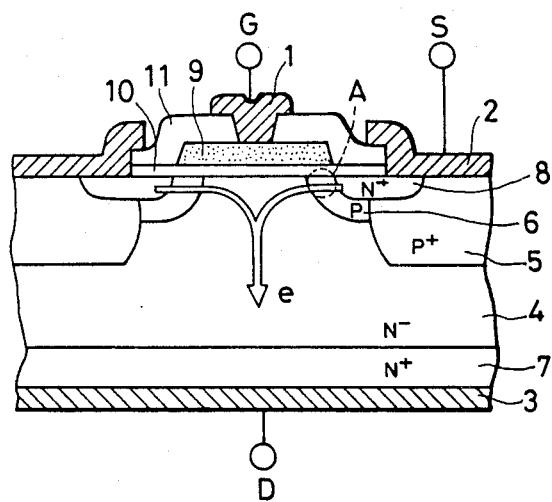
FIG. 4 is a cross-sectional view showing a main portion of a conventional vertical MOS-FET.

In the embodiment wherein the device is formed in the manner shown in FIG. 2, the gate polysilicon layer 9b may be formed as shown in the step of FIG. 3(d). The manufacturing process according to the present invention is advantageous in that it can be performed by the foregoing steps by leaving only a part of the field oxidation film 13 in the step of formation of the thick oxidation film 13e without requiring any other change in the procedure.

Although the above description relates to a MOS-FET having an N-channel, it will be apparent that the present invention is not limited to this embodiment but is also applicable to a MOS-FET having a P-channel so as to obtain the same effect.

Although the prior art conductivity modulation type MOS-FET with bipolar operation has an advantage that a large current density can be provided, this type of device is disadvantageous in that the current that can be utilized is limited due to the latch-up phenomenon caused by a parasitic thyristor. In contrast, according to the present invention, as described above with respect to the preferred embodiments, a part of the channel region surface where an inversion layer is formed is covered with an oxidation film thicker than a gate oxidation film in an active portion of the device so as to prevent the inversion layer from being produced in the portion of the channel region surface covered with the thick oxidation film. This eliminates a transit path of majority carries at that portion while, on the other hand, leaving a transit path of minority carries to thereby suppress the current due to the majority carries, so that the current required to cause the latch-up phenomenon is larger than the operation current.

I claim:

1. A conductivity modulation type vertical MOS-FET, comprising:

a semiconductor substrate of a first conductivity type acting as a drain layer;

a first base layer of a second conductivity type formed on said semiconductor substrate;

a second base layer of said first conductivity type formed on a surface of said first base layer;

a source layer of said second conductivity type formed on said second base layer;

a gate polysilicon layer formed over a channel region between said source layer and said first base layer; and a gate oxidation film formed between said gate polysilicon layer and said channel region; wherein a part of said gate oxidation film is thicker than the other part of said gate oxidation film on an active portion of said MOS-FET.

2. A conductivity modulation-type vertical MOS-FET, comprising:

a semiconductor substrate of a first conductivity type for functioning as a drain layer;

a first base layer of a second conductivity type formed on said substrate;

a second base layer of said first conductivity type formed on a surface of said first base layer;

a source layer of said second conductivity type formed on said second base layer;

said second base layer having a portion which forms a channel region surface where an inversion layer is formed between the source layer and the first base layer;

a gate oxidation film which is formed on said source layer, said second base layer and said first base layer and which has a thick oxidation film portion covering a portion of said channel region surface and a thin oxidation film portion covering an active portion of said MOS-FET; and a gate polysilicon layer formed on a surface on one of (a) said thin oxidation film portion and (b) said thin oxidation film portion and said thick oxidation film portion such that said thick oxidation film portion is disposed between said channel region portion where said inversion layer is formed and said gate polysilicon layer so as to prevent the inversion layer from being produced in said portion of said channel region surface covered by said thick oxidation film portion.

* * * * *